United States Patent

Banno

(10) Patent No.: US 9,444,971 B2
(45) Date of Patent: Sep. 13, 2016

(54) IMAGE PROCESSING SYSTEM, IMAGE PROCESSING METHOD, AND IMAGE PROCESSING PROGRAM

(71) Applicants: Teruyoshi Adachi, Tokyo (JP); Mitsunobu Kawamura, Tokyo (JP)

(72) Inventor: Yasushi Banno, Tokyo (JP)

(73) Assignees: Teruyoshi Adachi, Tokyo (JP); Mitsunobu Kawamura, Tokyo (JP)

( * ) Notice: Subject to any disclaimer, the term of this patent is extended or adjusted under 35 U.S.C. 154(b) by 0 days.

(21) Appl. No.: 14/475,279

(22) Filed: Sep. 2, 2014

(65) Prior Publication Data

US 2015/0201108 A1 Jul. 16, 2015

(30) Foreign Application Priority Data

Sep. 2, 2013 (JP) .................................. 2013-181121

(51) Int. Cl.
G06K 9/40 (2006.01)
H04N 1/40 (2006.01)
H03M 7/30 (2006.01)
H04N 1/41 (2006.01)

(52) U.S. Cl.
CPC .................. H04N 1/40 (2013.01); H03M 7/30 (2013.01); H04N 1/41 (2013.01)

(58) Field of Classification Search
CPC ........... H04N 1/40; H04N 1/41; H03M 7/30; G06K 9/40; G06K 15/128; G06T 3/403
USPC ......... 358/448, 443, 447; 382/266, 298, 299
See application file for complete search history.

(56) References Cited

U.S. PATENT DOCUMENTS

| 5,258,854 A * | 11/1993 | Eschbach | G06K 15/128 358/3.07 |
| 2005/0157940 A1* | 7/2005 | Hosoda | G06K 9/40 382/266 |
| 2006/0133698 A1* | 6/2006 | Kim | G06T 3/403 382/300 |
| 2010/0278422 A1* | 11/2010 | Iketani | G06T 3/403 382/165 |
| 2010/0322536 A1* | 12/2010 | Tezuka | G06T 3/00 382/300 |
| 2013/0121611 A1* | 5/2013 | Moriya | G06T 3/403 382/266 |

FOREIGN PATENT DOCUMENTS

JP H08-275153 A 10/1996

* cited by examiner

*Primary Examiner* — Cheukfan Lee
(74) *Attorney, Agent, or Firm* — Levine Bagade Han LLP

(57) ABSTRACT

There are disclosed an image processing system which can scale up an image while maintaining a quality of the image, an image processing method, and an image processing program. An image processing system 1 includes a separating section 12 which separates an image frame into a plurality of partial regions on the basis of characteristics; a dividing section 14 which divides the plurality of partial regions into a plurality of subdivided pixels; an integrating section 16 which generates an integrated frame in which the plurality of partial regions including the plurality of subdivided pixels are integrated; a difference calculating section 18 which calculates a difference in pixel value between one pixel of a plurality of pixels obtained by dividing the integrated frame and the other pixel selected on the basis of a spatial frequency of each of the plurality of pixels; a quantizing section 20 which quantizes the other pixel on the basis of the difference; a compressed data generating section 22 which generates compressed image data including the other pixel quantized in the quantizing section 20; and a decoding section 24 which decodes the compressed image data.

10 Claims, 4 Drawing Sheets

IMAGE PROCESSING SYSTEM, IMAGE PROCESSING METHOD, AND IMAGE PROCESSING PROGRAM

BACKGROUND OF THE INVENTION

1. Field of the Invention

The present invention relates to an image processing system, an image processing method, and an image processing program. More particularly, it relates to an image processing system which is applicable to scale-up processing of an image, an image processing method, and an image processing program.

2. Background Art

Heretofore, there have been known an image compression device including a difference calculation circuit to obtain a value of a difference between a luminance of each pixel in a block and a block representative value, a difference pattern classification circuit to specify a distribution pattern of the difference value corresponding to each pixel of the block, and a difference representative value calculation circuit to calculate a difference representative value which is representative of the block; and an image restoration device (e.g., see Patent Document 1). According to the image compression device and the image restoration device described in Patent Document 1, in addition to the block representative value output by the block representative value detection circuit, there are newly introduced, as image compression data, two parameters, i.e., the difference representative value which is calculated from the difference value and representative of the block, and the difference value distribution pattern. Therefore, an operation amount can be decreased, and a scale of hardware can be reduced to shorten a processing time.

[Patent Document 1] JP-A-H08-275153

SUMMARY OF THE INVENTION

However, in such image compression device and image restoration device as described in Patent Document 1, a compressed image and a restored image having a certain degree of quality can be obtained, but it is not possible to maintain an image quality such as smoothness in gradation or contour between scaled-up images.

Therefore, an object of the present invention is to provide an image processing system which can scale up an image while maintaining a quality of the image, an image processing method, and an image processing program.

According to the present invention, to achieve the above object, there is provided an image processing system which is applicable to scale-up processing of an image, including a separating section which separates an image frame into a plurality of partial regions on the basis of characteristics; a dividing section which divides the plurality of partial regions into a plurality of subdivided pixels; an integrating section which generates an integrated frame in which the plurality of partial regions including the plurality of subdivided pixels are integrated; a difference calculating section which calculates a difference in pixel value between one pixel of a plurality of pixels obtained by dividing the integrated frame and the other pixel selected on the basis of a spatial frequency of each of the plurality of pixels; a quantizing section which quantizes the other pixel on the basis of the difference; a compressed data generating section which generates compressed image data including the other pixel quantized in the quantizing section; and a decoding section which decodes the compressed image data.

Furthermore, in the above image processing system, the characteristics include an R-component, a G-component and a B-component of the pixels, and the separating section may separate the image frame into the plurality of partial regions by the R-component, the G-component and the B-component.

Furthermore, in the above image processing system, the image frame may be one image frame included in a dynamic image having a plurality of image frames.

Furthermore, when voice data is included in the image frame, the above image processing system can further include a voice separating section which separates the voice data into partial voice data for each of a plurality of predetermined frequency bands, a tendency predicting section which generates predicted voice data in which a waveform tendency is predicted for each of the plurality of pieces of partial voice data; and an integrated voice data high quality processing section which integrates phases of waveforms represented by the partial voice data.

Furthermore, according to the present invention, to achieve the above object, there is provided an image processing method which is applicable to scale-up processing of an image, including a separating step of separating an image frame into a plurality of partial regions on the basis of characteristics; a dividing step of dividing the plurality of partial regions into a plurality of subdivided pixels; an integrating step of generating an integrated frame in which the plurality of partial regions including the plurality of subdivided pixels are integrated; a difference calculating step of calculating a difference in pixel value between one pixel of a plurality of pixels obtained by dividing the integrated frame and the other pixel selected on the basis of a spatial frequency of each of the plurality of pixels; a quantizing step of quantizing the other pixel on the basis of the difference; a compressed data generating step of generating compressed image data including the other pixel quantized in the quantizing step; and a decoding step of decoding the compressed image data.

Furthermore, according to the present invention, to achieve the above object, there is provided an image processing program for an image processing system which is applicable to scale-up processing of an image, the image processing program allowing a computer to realize a separating function of separating an image frame into a plurality of partial regions on the basis of characteristics; a dividing function of dividing the plurality of partial regions into a plurality of subdivided pixels; an integrating function of generating an integrated frame in which the plurality of partial regions including the plurality of subdivided pixels are integrated; a difference calculating function of calculating a difference in pixel value between one pixel of a plurality of pixels obtained by dividing the integrated frame and the other pixel selected on the basis of a spatial frequency of each of the plurality of pixels; a quantizing function of quantizing the other pixel on the basis of the difference; a compressed data generating function of generating compressed image data including the other pixel quantized in the quantizing function; and a decoding function of decoding the compressed image data.

According to the image processing system, the image processing method and the image processing program of the present invention, there can be provided an image processing system which can scale up an image while maintaining a quality of the image, an image processing method, and an image processing program.

DESCRIPTION OF THE PREFERRED EMBODIMENTS

[Embodiment]
(Outline of Image Processing System 1)

An image processing system 1 according to the present embodiment is an image processing system which is applicable to scale-up processing and/or compression processing of an image. Specifically, the image processing system 1 is a system which can freely perform quality heightening, reversible compression, enlargement, reduction and the like of a static image and/or a dynamic image, and can also freely perform quality heightening, reversible compression and the like of voice digital data. For example, the image processing system 1 separates an image frame into a plurality of partial regions by predetermined characteristics. Next, the image processing system 1 further subdivides the plurality of separated partial regions, and then integrates the plurality of subdivided partial regions to generate an integrated frame. Then, the image processing system 1 sets one pixel of a plurality of pixels constituting the integrated frame to a reference pixel, and compresses the integrated frame on the basis of a pixel value difference between a pixel value of the one pixel and a pixel value of the other pixel selected on the basis of a spatial frequency of each pixel.

Therefore, the image processing system 1 subdivides an original image. Therefore, even when the original image is noticeably enlarged (e.g., the enlargement of about 100 times from the original image at an area ratio), it is possible to provide an enlarged image from which generation of block noise, false color, jaggy or the like is eliminated and in which a depth feeling and/or a texture of the image is improved. Furthermore, the image processing system 1 sets the one pixel of the integrated frame to the reference pixel and compresses the integrated frame on the basis of the difference in pixel value between the other pixel and the one pixel, so that the image can substantially reversibly be compressed and decoded.

(Details of Image Processing System 1)

Figure 1:
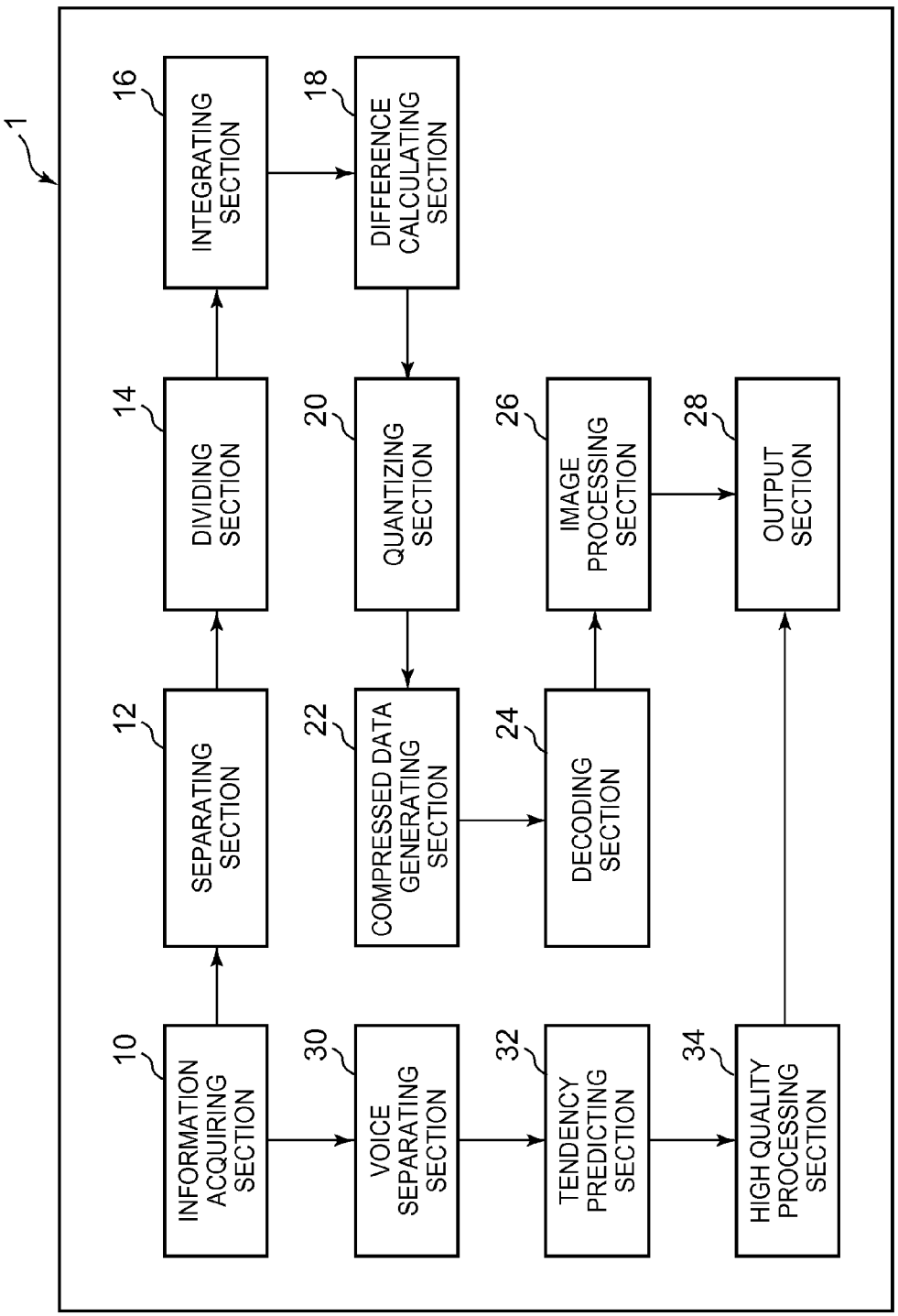
FIG. 1 is a function constitutional block diagram of an image processing system according to an embodiment of the present invention.
Figure 2:
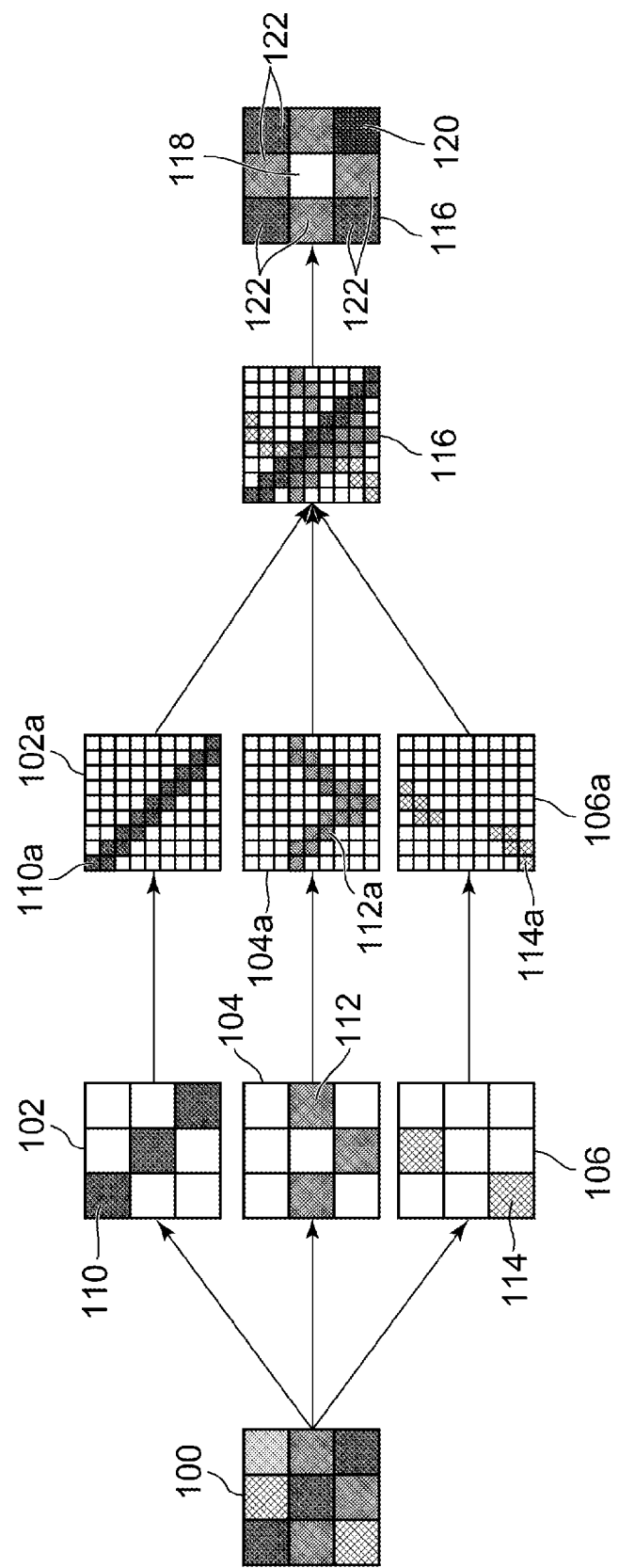
FIG. 2 is a flowchart schematically showing processing of the image processing system according to the embodiment of the present invention.

FIG. 1 shows one example of a function constitutional block of the image processing system according to the present embodiment. Furthermore, FIG. 2 schematically shows one example of a flow of processing of the image processing system according to the present embodiment.

The image processing system 1 includes an information acquiring section 10 which acquires image data including the image frame, a separating section 12 which separates the image frame into the plurality of partial regions, a dividing section 14 which divides the plurality of partial regions into a plurality of subdivided pixels, an integrating section 16 which generates the integrated frame, a difference calculating section 18 which calculates the difference in pixel value between the one pixel and the other pixel of the integrated frame, a quantizing section 20 which quantizes each pixel of the integrated frame on the basis of the difference, and a compressed data generating section 22 which generates compressed image data including the respective quantized pixels.

Furthermore, the image processing system 1 includes a decoding section 24 which decodes the compressed image data, an image processing section 26 which subjects the decoded compressed image data to image processing, and an output section 28 which outputs the data subjected to the image processing. Furthermore, the image processing system 1 includes a voice separating section 30 which separates voice data into partial voice data for each of a plurality of frequency bands, a tendency predicting section 32 which predicts a waveform tendency of the partial voice data, and a high quality processing section 34 which integrates the plurality of pieces of partial voice data on the basis of the predicted waveform tendency.

(Information Acquiring Section 10)

The information acquiring section 10 acquires the image data and/or the voice data from the outside. Furthermore, when the voice data is included in the image data, the information acquiring section 10 acquires the image data together with the voice data. Here, the image data is static image data or dynamic image data. The image data may be one of undeveloped image data of a raw image or the like and completed image data of JPEG, MPEG or the like. Furthermore, the image data has the image frame including the plurality of pixels. For example, the static image data has one image frame including the plurality of pixels. Furthermore, the dynamic image data has a plurality of image frames continuously arranged along time series.

When the information acquiring section 10 acquires the image data, the information acquiring section supplies the image frame constituting the acquired image data to the separating section 12. That is, when the information acquiring section 10 acquires the static image data, the information acquiring section supplies one image frame constituting the static image data to the separating section 12. Furthermore, when the information acquiring section 10 acquires the dynamic image data, the information acquiring section successively supplies, to the separating section 12, one image frame included in a plurality of image frames constituting the dynamic image data. Furthermore, when the information acquiring section 10 acquires the voice data, the information acquiring section supplies the acquired voice data to the voice separating section 30.

(Separating Section 12)

The separating section 12 separates the image frame into the plurality of partial regions on the basis of the characteristics of the image frame. Here, examples of the characteristics include a color tone, gradation, and spatial frequency. Specifically, the separating section 12 separates the one image frame into the plurality of partial regions on the basis of the characteristics of the pixels included in the one image frame. As one example, when the characteristics indicate an R-component, a G-component and a B-component of the pixels, the separating section 12 separates the image frame by the R-component, the G-component and B-component, to generate partial frames as the plurality of partial regions.

For example, as shown in FIG. 2, when an image frame 100 includes the pixel of the R-component, the pixel of the G-component and the pixel of the B-component, the separating section 12 separates the image frame 100 into a partial frame 102 as the partial region where the pixel of the R-component is separated, a partial frame 104 as the partial region where the pixel of the G-component is separated, and a partial frame 106 as the partial region where the pixel of the B-component is separated. The separating section 12 supplies, to the dividing section 14, information indicating the plurality of generated partial regions.

(Separating Section 14)

The dividing section 14 divides each of the plurality of partial regions into the plurality of subdivided pixels. That is, the dividing section 14 divides the partial frame as one partial region into the predetermined number of subdivided pixels. It is to be noted that processing of dividing the partial region into the plurality of subdivided pixels will be referred to as "pico-pixel formation" in the present embodiment. Furthermore, the dividing section 14 can predict and generate the subdivided pixels on the basis of a result obtained by applying statistical processing to a gradation change of an analog film or the like, a dyestuff appearance rule, or the like. As one example, as shown in FIG. 2, the partial frame 102 received from the separating section 12 by the dividing section 14 includes 3×3 pixels. The dividing section 14 performs the pico-pixel formation from the pixels of the partial frame 102 into, for example, 9×9 pixels to generate a subdivided partial frame 102a.

Furthermore, the partial frame 102 includes the R-component pixels (three pixels 110 in the example of FIG. 2) before the frame is supplied to the dividing section 14 in the example of FIG. 2. Furthermore, the dividing section 14 divides the partial frame 102 into the subdivided pixels of 9×9 pixels, and the three R-component pixels 110 are thereby divided into a plurality of R-component subdivided pixels 110a (17 subdivided pixels 110a in the example of FIG. 2). Here, the dividing section 14 performs, for example, the statistical processing of the dyestuff appearance rule of the R-component, to predict which subdivided pixels among the 9×9 pixels are occupied by the R-component, thereby generating the R-component subdivided pixels 110a.

Similarly, the dividing section 14 generates a partial frame 104a by the pico-pixel formation of the pixels of the partial frame 104 (including G-component pixels 112), and generates a partial frame 106a by the pico-pixel formation from the pixels of the partial frame 106 (including B-component pixels 114). Furthermore, the dividing section generates G-component subdivided pixels 112a and B-component subdivided pixels 114a. The dividing section 14 supplies, to the integrating section 16, the plurality of partial frames as the plurality of partial regions including the plurality of generated subdivided pixels.

(Integrating Section 16)

The integrating section 16 generates the integrated frame in which the plurality of partial regions including the plurality of subdivided pixels received from the dividing section 14 are integrated. For example, the integrating section 16 superimposes the plurality of partial frames as the plurality of partial regions on one another to generate the integrated frame. As one example, the integrating section 16 superimposes the partial frame 102a, the partial frame 104a and the partial frame 106a on one another, to generate an integrated frame 116 as shown in FIG. 2. The integrating section 16 supplies the generated integrated frame 116 to the difference calculating section 18.

(Difference Calculating Section 18)

The difference calculating section 18 calculates a difference in pixel value between one pixel of the plurality of pixels obtained by dividing the integrated frame received from the integrating section 16 and the other pixel selected on the basis of the spatial frequency of each of the plurality of pixels. Specifically, the difference calculating section 18 selects a reference pixel 118 as the one pixel from a plurality of pixels constituting the integrated frame 116. Next, the difference calculating section 18 calculates the spatial frequency of each of the plurality of pixels constituting the integrated frame 116. The difference calculating section 18 selects a plurality of pixels excluding a pixel (a pixel 120 in the example of FIG. 2) including a frequency component of a predetermined frequency or more (hereinafter, referred to as "a high frequency component", as the other pixels (a plurality of pixels 122 in the example of FIG. 2). Furthermore, the difference calculating section 18 calculates the difference in pixel value between the reference pixel 118 and each of the other pixels. The difference calculating section 18 supplies information indicating the calculated differences to the quantizing section 20.

(Quantizing Section 20)

The quantizing section 20 quantizes the other pixel selected in the difference calculating section 18 on the basis of the difference calculated by the difference calculating section 18. That is, the quantizing section 20 does not quantize the reference pixel 118 as the one pixel, and the pixel which is not selected as the other pixel in the difference calculating section 18. It is to be noted that for the purpose of reducing a load of the processing, the quantizing section 20 can execute the quantization by calculation processing in which addition and subtraction are mainly used.

As one example, the difference calculating section 18 performs the statistical processing of the spatial frequency of each of the plurality of pixels constituting the integrated frame 116 to calculate an appearance ratio of the predetermined spatial frequency or the spatial frequency of a predetermined frequency range. Furthermore, the difference calculating section 18 selects one pixel from the plurality of pixels as the pixel which is not to be quantized in the quantizing section 20, and also selects the pixel of a predetermined appearance ratio or less (e.g., a pixel having a high frequency component). On the other hand, the difference calculating section 18 selects a plurality of pixels having an appearance ratio in excess of the predetermined appearance ratio (e.g., pixels having low frequency components) as the pixels to be quantized.

Next, the difference calculating section 18 supplies, to the quantizing section 20, information indicating the pixels to be quantized and information indicating the pixel which is not to be quantized together with information indicating the differences. Then, the quantizing section 20 executes the quantization. The quantizing section 20 supplies, to the compressed data generating section 22, information indicating the plurality of quantized pixels, information indicating the reference pixel, and information indicating the pixel which is not quantized.

(Compressed Data Generating Section 22)

The compressed data generating section 22 generates the compressed image data in which a data size is compressed. That is, the compressed data generating section 22 generates the compressed image data including the other pixels quantized in the quantizing section 20. The compressed data generating section 22 supplies the generated compressed image data to the decoding section 24.

(Decoding Section 24)

The decoding section 24 decodes the compressed image data. Here, the compressed data generating section 22 generates the compressed image data, in a state where data of one pixel and part of pixels constituting the integrated frame 116 is held and the other pixels are quantized. Therefore, even when the decoding section 24 decodes the compressed image data, an image quality substantially does not deteriorate. Therefore, the image processing system 1 according to the present embodiment can substantially reversibly compress the image data. The decoding section 24 supplies the decoded compressed image data to the image processing section 26.

(Image Processing Section 26)

The image processing section 26 subjects, to the image processing, the decoded compressed image data received from the decoding section 24. Examples of the image processing include processing of smoothly and finely connecting the respective pixels, correction processing of inhibiting generation of noise, refocus processing of sharpening a contour line of an object included in the image without raising a contrast, enlargement processing (i.e., the scale-up processing), reduction processing, and tone curve correction processing of improving a texture and a depth feeling of the object included in the image on the basis of a color management standard. The image processing section 26 supplies the data subjected to the image processing to the output section 28.

(Voice Separating Section 30)

When the voice data is included in the image frame received from the information acquiring section 10 and when the voice data is received from the information acquiring section 10, the voice separating section 30 separates the received voice data into the partial voice data for each of the plurality of predetermined frequency bands. For example, the voice separating section 30 separates the voice data for each of three frequency bands, i.e., a first frequency band, a second frequency band including a frequency lower than the first frequency band, and a third frequency band including a frequency lower than the second frequency band. The voice separating section 30 supplies a plurality of pieces of separated partial voice data to the tendency predicting section 32.

(Tendency Predicting Section 32)

The tendency predicting section 32 predicts the waveform tendency for each of the plurality of pieces of partial voice data received from the voice separating section 30 to generate predicted voice data. Specifically, the tendency predicting section 32 analyzes the partial voice data by use of a predetermined statistical technique, and predicts an original sound waveform of voice represented by the partial voice data to generate the predicted voice data. In consequence, the tendency predicting section 32 restores a sound range cut when the voice data is digitized. The tendency predicting section 32 supplies the generated predicted voice data to the high quality processing section 34.

(High Quality Processing Section 34)

The high quality processing section 34 regulates and integrates phases of waveforms represented by the predicted voice data received from the tendency predicting section 32 to generate integrated voice data. Specifically, on the basis of the fact that a propagation speed of a sound wave varies with each of the plurality of frequency bands, the high quality processing section 34 generates the integrated voice data so that voice is optimized for user's sense of hearing, when the voice represented by the integrated voice data reaches the user. In consequence, the image processing system 1 can compress and restore the voice which contributes to realization of sound image localization. The high quality processing section 34 supplies the generated integrated voice data to the output section 28.

(Output Section 28)

The output section 28 outputs the data received from the image processing section 26. The output section 28 can output the data in a predetermined format. Furthermore, when the output section 28 receives the integrated voice data from the high quality processing section 34, the output section outputs the integrated voice data or the voice generated from the integrated voice data. Here, the output section 28 can output the image data and the voice data to a predetermined recording medium, output the data so that the data is visible to the user, and output the data to a predetermined terminal and a predetermined information processing device. Furthermore, the output section 28 can output the data via a mobile phone network or a communication network such as an internet.

(Outline of Image Processing Method)

Figure 3:
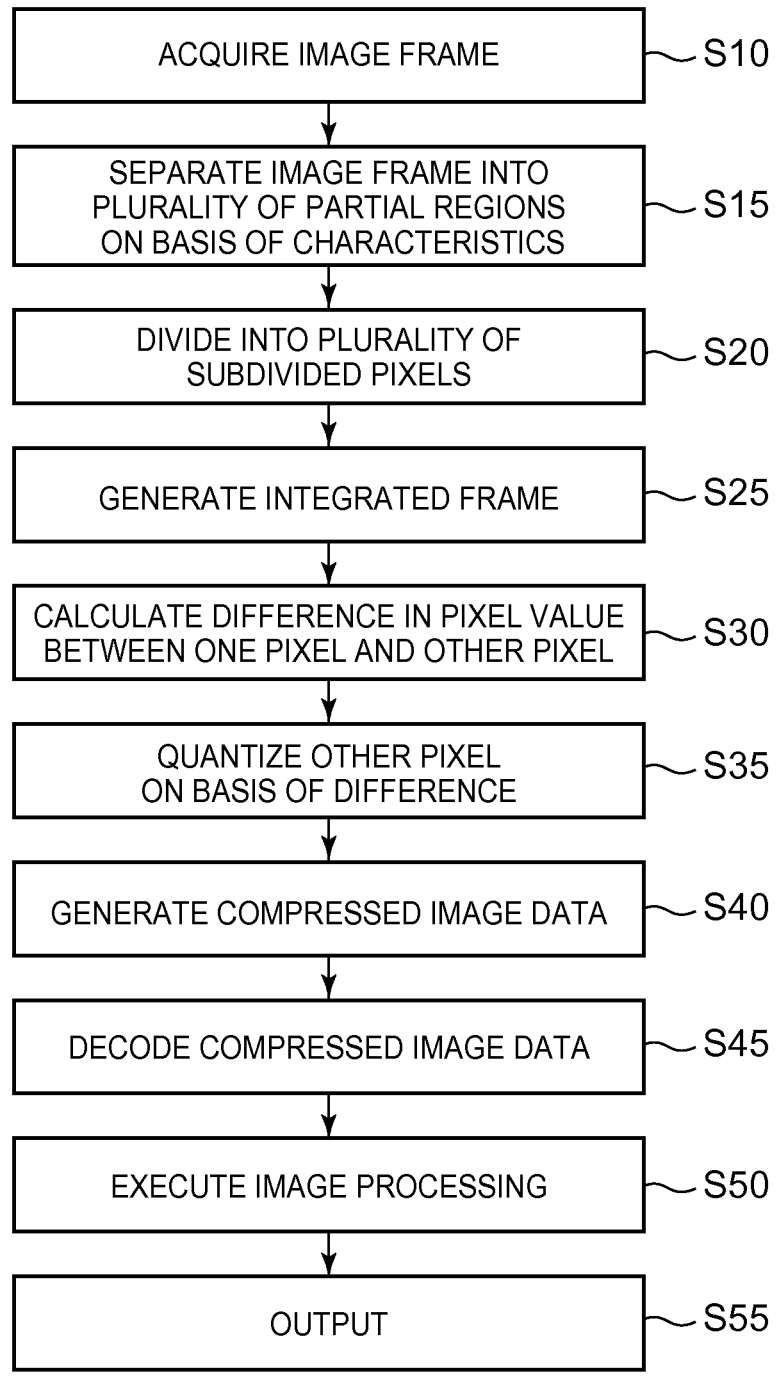
FIG. 3 is a flowchart of processing of the image processing system according to the embodiment of the present invention.

FIG. 3 shows one example of a flow of processing of the image processing system according to the embodiment of the present invention.

First, the information acquiring section 10 acquires the image data and also acquires the image frame constituting the image data (step 10, hereinafter the step is abbreviated to "S"). The information acquiring section 10 supplies the acquired image frame to the separating section 12. The separating section 12 separates the image frame into the plurality of partial regions on the basis of the characteristics of the pixels (e.g., information on the R-component, the G-component and the B-component) (S15). The separating section 12 supplies information indicating the plurality of generated partial regions to the dividing section 14.

The dividing section 14 divides a partial frame as one partial region into the predetermined number of subdivided pixels (S20). The dividing section 14 supplies, to the integrating section 16, the plurality of partial frames as the plurality of partial regions including the plurality of generated subdivided pixels. The integrating section 16 generates the integrated frame integrated by superimposing, on one another, the plurality of partial regions including the plurality of subdivided pixels (S25). The integrating section 16 supplies the integrated frame to the difference calculating section 18. The difference calculating section 18 calculates the difference in pixel value between the one pixel of the plurality of pixels obtained by dividing the image frame into a plurality of frames and the other pixel selected on the basis of the spatial frequency of each of the plurality of pixels (S30). The difference calculating section 18 supplies the information indicating the calculated difference to the quantizing section 20.

The quantizing section 20 quantizes the other pixel selected in the difference calculating section 18 on the basis of the difference calculated by the difference calculating section 18 (S35). That is, the quantizing section 20 maintains information on the one pixel and information on the pixel having a low appearance ratio as they are, and only quantizes the pixel having a high appearance ratio. The quantizing section 20 supplies the information indicating the plurality of quantized pixels, the information indicating the reference pixel and the information indicating the pixel which is not quantized to the compressed data generating section 22.

The compressed data generating section 22 generates the compressed image data in which the data size is reversibly compressed (S40). The compressed data generating section 22 supplies the compressed image data to the decoding section 24. The decoding section 24 decodes the compressed image data (S45). The decoding section 24 supplies the decoded compressed image data to the image processing section 26. The image processing section 26 executes the image processing to the decoded compressed image data received from the decoding section 24 (S50). The image processing section 26 supplies the data subjected to the image processing to the output section 28. Furthermore, the output section 28 outputs the data received from the image processing section 26 to the outside (S55).

Figure 4:
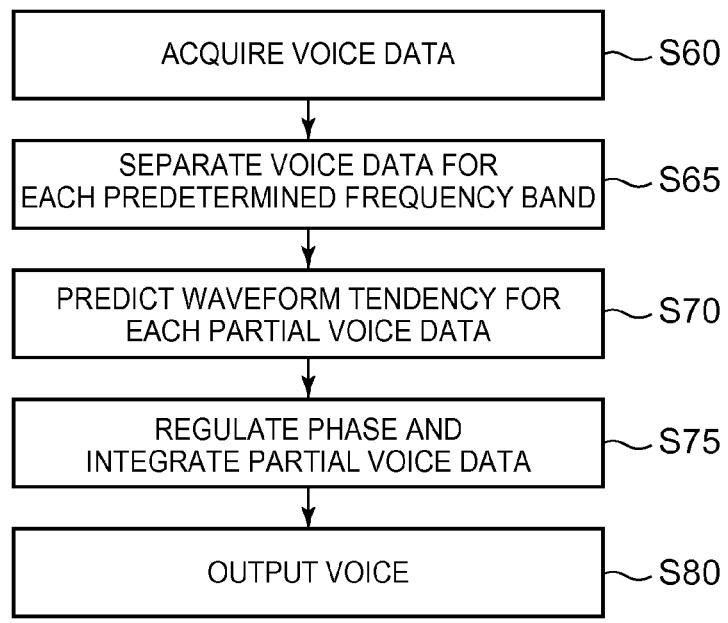
FIG. 4 is a flowchart of processing of voice data of the image processing system according to the embodiment of the present invention.

FIG. 4 shows one example of a flow of the processing of the voice data of the image processing system according to the embodiment of the present invention.

The information acquiring section 10 acquires the voice data (S60). It is to be noted that the information acquiring section 10 can acquire the voice data alone and can also acquire the voice data accompanying the image data. The information acquiring section 10 supplies the acquired voice data to the voice separating section 30. The voice separating section 30 divides the received voice data into the partial voice data for each of the plurality of predetermined frequency bands (S65). The voice separating section 30 supplies the plurality of pieces of separated partial voice data to the tendency predicting section 32.

The tendency predicting section 32 predicts the waveform tendency concerning each of the plurality of pieces of partial voice data received from the voice separating section 30 to generate the predicted voice data (S70). The tendency predicting section 32 supplies the generated predicted voice data to the high quality processing section 34. The high quality processing section 34 regulates the phases of the waveforms represented by the predicted voice data received from the tendency predicting section 32, and integrates the partial voice data to generate the integrated voice data (S75). The high quality processing section 34 supplies the integrated voice data to the output section 28. The output section 28 outputs the integrated voice data (S80).

Figure 5:
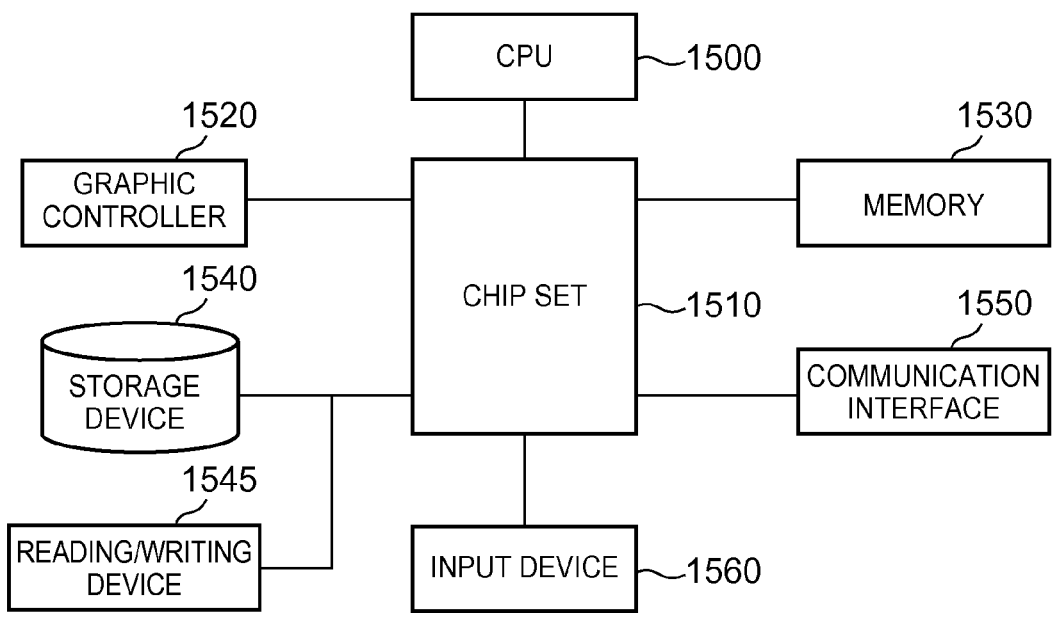
FIG. 5 is a hardware constitutional view of the image processing system according to the embodiment of the present invention.

FIG. 5 shows one example of a hardware constitution of the image processing system according to the embodiment of the present invention.

The image processing system 1 according to the present embodiment includes a CPU 1500, a graphic controller 1520, a memory 1530 such as a random access memory (RAM), a read-only memory (ROM) and/or a flash ROM, a storage device 1540 which stores data, a reading/writing device 1545 which reads the data from a recording medium and/or writes the data into the recording medium, an input device 1560 which inputs the data, a communication interface 1550 which transmits the data to an external communication apparatus and receives the data from the apparatus, and a chip set 1510 which mutually communicatively connects the CPU 1500, the graphic controller 1520, the memory 1530, the storage device 1540, the reading/writing device 1545, the input device 1560 and the communication interface 1550.

The chip set 1510 connects the memory 1530, the CPU 1500 which accesses the memory 1530 to execute predetermined processing and the graphic controller 1520 which controls display of an external display device to one another, thereby executing transfer of the data among the respective constitutional elements. The CPU 1500 operates on the basis of a program stored in the memory 1530 to control the respective constitutional elements. The graphic controller 1520 displays an image in a predetermined display device on the basis of the image data temporarily stored on a buffer disposed in the memory 1530.

Furthermore, the chip set 1510 connects the storage device 1540, the reading/writing device 1545 and the communication interface 1550. The storage device 1540 stores the program and data for use in the CPU 1500 of the image processing system 1. The storage device 1540 is, for example, a flash memory. The reading/writing device 1545 reads the program and/or the data from the recording medium in which the program and/or data is stored, to store the read program and/or the data in the storage device 1540. For example, the reading/writing device 1545 acquires the predetermined program from a server on an internet via the communication interface 1550, to store the acquired program in the storage device 1540.

The communication interface 1550 executes the transmission/reception of the data with an external device via the communication network. Furthermore, when the communication network is interrupted, the communication interface 1550 can execute the transmission/reception of the data with the external device via no communication network. Furthermore, the input device 1560, for example, a keyboard, a tablet or a mouse is connected to the chip set 1510 via a predetermined interface.

An image processing program for the image processing system 1 which is to be stored in the storage device 1540 is supplied to the storage device 1540 via a communication network such as the internet or a recording medium such as a magnetic recording medium or an optical recording medium. Furthermore, the program for the image processing system 1 which is stored in the storage device 1540 is executed by the CPU 1500.

The image processing program to be executed by the image processing system 1 according to the present embodiment works on the CPU 1500, thereby allowing the image processing system 1 to function as the information acquiring section 10, the separating section 12, the dividing section 14, the integrating section 16, the difference calculating section 18, the quantizing section 20, the compressed data generating section 22, the decoding section 24, the image processing section 26, the output section 28, the voice separating section 30, the tendency predicting section 32 and the high quality processing section 34 described with reference to FIG. 1 to FIG. 4.

(Effect of Embodiment)

The image processing system 1 according to the present embodiment separates the image data into the plurality of partial frames on the basis of the characteristics of the pixels, and further subdivides the plurality of pixels constituting each partial frame, so that it is possible to prevent the information on the image from being impaired from the image data by the image processing such as scale-up processing. In consequence, the image processing system 1 can generate an enlarged image having a natural edge (i.e., a smooth edge), a feeling of gradation, a stereoscopic vision effect and a texture while inhibiting or reducing jaggy, false color, granular feeling, noise and the like, even when the image is enlarged at a high magnification.

Furthermore, the image processing system 1 according to the present embodiment can select the pixel which becomes a reference from the integrated frame, and select a pixel in which an amount of information is to be compressed, on the basis of the spatial frequency of the pixel, so that the large compression processing and decode processing can be executed without substantially impairing an image quality and a part of the image data. In consequence, the image processing system 1 can contribute to the shortening of a communication time during the transmission/reception of the image data having a large amount of the information, the inhibition of a load of communication and the saving of a capacity of storage.

Furthermore, the image processing system 1 according to the present embodiment can reversibly compress the image data and the voice data. Therefore, the system is applicable to a service in which a value of an image is enhanced by processing of improving the quality of the image or processing of enlarging the image, for example, a cloud service in which the communication load and storage load are reduced, a service to supply the static image and dynamic image to a portable information communication terminal such as a smartphone in a state where the communication load is reduced, or a service to manage and process the static image and dynamic image in a terminal such as a personal computer.

In the above, the embodiment of the present invention has been described, but the abovementioned embodiment does not limit the invention according to claims. Furthermore, it is to be noted that all combinations of characteristics described in the embodiment are not necessarily essential for means for solving the problem of the present invention. Furthermore, any technical element of the abovementioned embodiment may be applied alone or may be divided into a plurality of portions such as a program component and a hardware component, and applied.

DESCRIPTION OF REFERENCE SIGNS 1 image processing system
10 information acquiring section
12 separating section
14 dividing section
16 integrating section
18 difference calculating section
20 quantizing section
22 compressed data generating section
24 decoding section
26 image processing section
28 output section
30 voice separating section
32 tendency predicting section
34 high quality processing section
100 image frame
102, 102a, 104, 104a, 106, and 106a partial frame
110, 112, and 114 pixel
110a, 112a, and 114a subdivided pixel
116 integrated frame
118 reference pixel
120, 122 pixel
1500 CPU
1510 chip set
1520 graphic controller
1530 memory
1540 storage device
1545 reading/writing device
1550 communication interface
1560 input device

What is claimed is:

1. An image processing system which is applicable to scale-up processing of an image, comprising:
   a separating section which separates an image frame into a plurality of partial regions based on characteristics, the image frame comprising a plurality of pixels;
   a dividing section which divides the plurality of partial regions into a plurality of subdivided pixels;
   an integrating section which generates an integrated frame in which the plurality of partial regions including the plurality of subdivided pixels are integrated;
   a difference calculating section which calculates a difference in pixel value between one pixel of a plurality of pixels obtained by dividing the integrated frame and another pixel selected based on a spatial frequency of each of the plurality of pixels;
   a quantizing section which quantizes the other pixel based on the difference;
   a compressed data generating section which generates compressed image data including the other pixel quantized in the quantizing section; and
   a decoding section which decodes the compressed image data.

2. The image processing system according to claim 1, wherein the characteristics include an R-component, a G-component and a B-component of the pixels, and the separating section separates the image frame into the plurality of partial regions by the R-component, the G-component and the B-component.

3. The image processing system according to claim 2, further comprising, when voice data is included in the image frame,
   a voice separating section which separates the voice data into partial voice data for each of a plurality of predetermined frequency bands;
   a tendency predicting section which generates predicted voice data in which a waveform tendency is predicted for each of the plurality of pieces of partial voice data; and
   an integrated voice data high quality processing section which integrates phases of waveforms represented by the partial voice data.

4. The image processing system according to claim 2, wherein the image frame is one image frame included in a dynamic image having a plurality of image frames.

5. The image processing system according to claim 4, further comprising, when voice data is included in the image frame,
   a voice separating section which separates the voice data into partial voice data for each of a plurality of predetermined frequency bands;
   a tendency predicting section which generates predicted voice data in which a waveform tendency is predicted for each of the plurality of pieces of partial voice data; and
   an integrated voice data high quality processing section which integrates phases of waveforms represented by the partial voice data.

6. The image processing system according to claim 1, wherein the image frame is one image frame included in a dynamic image having a plurality of image frames.

7. The image processing system according to claim 6, further comprising, when voice data is included in the image frame,
   a voice separating section which separates the voice data into partial voice data for each of a plurality of predetermined frequency bands;
   a tendency predicting section which generates predicted voice data in which a waveform tendency is predicted for each of the plurality of pieces of partial voice data; and
   an integrated voice data high quality processing section which integrates phases of waveforms represented by the partial voice data.

8. The image processing system according to claim 1, further comprising, when voice data is included in the image frame,
   a voice separating section which separates the voice data into partial voice data for each of a plurality of predetermined frequency bands;

a tendency predicting section which generates predicted voice data in which a waveform tendency is predicted for each of the plurality of pieces of partial voice data; and an integrated voice data high quality processing section which integrates phases of waveforms represented by the partial voice data.

9. An image processing method which is applicable to scale-up processing of an image, comprising:

a separating step of separating an image frame into a plurality of partial regions based on characteristics, the image frame comprising a plurality of pixels;

a dividing step of dividing the plurality of partial regions into a plurality of subdivided pixels;

an integrating step of generating an integrated frame in which the plurality of partial regions including the plurality of subdivided pixels are integrated;

a difference calculating step of calculating a difference in pixel value between one pixel of a plurality of pixels obtained by dividing the integrated frame and another pixel selected based on a spatial frequency of each of the plurality of pixels;

a quantizing step of quantizing the other pixel based on the difference;

a compressed data generating step of generating compressed image data including the other pixel quantized in the quantizing step; and a decoding step of decoding the compressed image data.

10. A non-transitory computer readable storage medium storing image processing program code instructions configured to be executed by an image processing system, which is applicable to scale-up processing of an image, and configured to cause the image processing system to perform:

a separating function of separating an image frame into a plurality of partial regions based on characteristics, the image frame comprising a plurality of pixels;

a dividing function of dividing the plurality of partial regions into a plurality of subdivided pixels;

an integrating function of generating an integrated frame in which the plurality of partial regions including the plurality of subdivided pixels are integrated;

a difference calculating function of calculating a difference in pixel value between one pixel of a plurality of pixels obtained by dividing the integrated frame and another pixel selected based on a spatial frequency of each of the plurality of pixels;

a quantizing function of quantizing the other pixel based on the difference;

a compressed data generating function of generating compressed image data including the other pixel quantized in the quantizing function; and a decoding function of decoding the compressed image data.

* * * * *